(12) United States Patent
Xi et al.

(10) Patent No.: US 10,607,558 B2
(45) Date of Patent: Mar. 31, 2020

(54) GATE DRIVING CIRCUIT

(71) Applicant: AU Optronics Corporation, Hsin-Chu (TW)

(72) Inventors: Peng-Bo Xi, Hsin-Chu (TW); Sung-Yu Su, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 101 days.

(21) Appl. No.: 15/787,900

(22) Filed: Oct. 19, 2017

(65) Prior Publication Data

US 2018/0240427 A1    Aug. 23, 2018

(30) Foreign Application Priority Data

Feb. 20, 2017 (TW) .............................. 106105648 A

(51) Int. Cl.
*G09G 3/36* (2006.01)
*G11C 19/38* (2006.01)
*G11C 19/28* (2006.01)
*G09G 3/3266* (2016.01)

(52) U.S. Cl.
CPC ......... *G09G 3/3674* (2013.01); *G09G 3/3677* (2013.01); *G11C 19/28* (2013.01); *G11C 19/38* (2013.01); *G09G 3/3266* (2013.01); *G09G 2310/0286* (2013.01); *G09G 2310/0289* (2013.01); *G09G 2310/08* (2013.01)

(58) Field of Classification Search
CPC ... G09G 2310/0286; G09G 2310/0289; G09G 2310/08; G09G 3/3266; G09G 3/3674; G09G 3/3677; G09G 2310/04; G11C 19/28; G11C 19/38
See application file for complete search history.

(56) References Cited

U.S. PATENT DOCUMENTS

| | | | |
|---|---|---|---|
| 7,161,576 B2 | 1/2007 | Kawabe et al. | |
| 10,096,372 B2 | 10/2018 | Chan | |
| 10,204,579 B2 | 2/2019 | Xiao et al. | |
| 2012/0194489 A1 | 8/2012 | Iwamoto et al. | |
| 2017/0169784 A1* | 6/2017 | Xiao | G09G 3/3677 |
| 2018/0211717 A1* | 7/2018 | Feng | G09G 3/3677 |
| 2018/0366208 A1* | 12/2018 | Chan | G09G 3/3677 |

FOREIGN PATENT DOCUMENTS

| | | |
|---|---|---|
| CN | 105139796 A | 12/2015 |
| CN | 106297624 A | 1/2017 |

OTHER PUBLICATIONS

An Office Action dated Nov. 21, 2019 issued by CNIPO for the corresponding CN patent application.

* cited by examiner

*Primary Examiner* — Patrick N Edouard
*Assistant Examiner* — Douglas M Wilson
(74) *Attorney, Agent, or Firm* — WPAT, PC

(57) ABSTRACT

A gate driving circuit includes a plurality of shift register circuits, where the shift register circuits are configured to drive a plurality of pixel rows. The gate driving circuit may be operated in a first mode and a second mode. When the gate driving circuit is operated in the first mode, the gate driving circuit is configured to drive, in a single frame, all pixel rows to be displayed. When the gate driving circuit is operated in the second mode, the gate driving circuit is configured to drive, in the single frame, some of the pixel rows to be displayed, and driven pixel rows of two adjacent frames are different.

15 Claims, 8 Drawing Sheets

GATE DRIVING CIRCUIT

BACKGROUND

Technical Field

The present disclosure relates to a gate driving circuit, and particularly to a gate driving circuit suitable for a high frame rate (HFR) display device.

Related Art

A conventional display device includes a data driving circuit, a gate driving circuit, and a plurality rows of pixels, where the gate driving circuit includes a plurality of shift register circuits which are configured to output a plurality of driving signals to drive the plurality rows of pixels in the display device. The driven pixels receive display data provided by the data driving circuit and display the same. In recent years, in order to satisfy requirements of customers, a resolution ratio of the display device is kept increasing. That is, during a display time of a single frame, the display device needs to drive more pixel rows. Moreover, an added pixel row means that relevant electronic components are also correspondingly added. In order to effectively reduce the relevant electronic components and increasing of a corresponding cost, the display device may use a multiplexer component to drive the pixel row. However, when the display device is operated in a display mode of a high frame rate (HFR), a switching capability of the multiplexer component needs to be considered. Therefore, the display device with the multiplexer component is difficult to be operated in the HFR display mode.

SUMMARY

In order to resolve the foregoing disadvantage, the present disclosure provides a gate driver embodiment, where the gate driver includes a plurality of shift register circuits. An Nth-stage shift register circuit is configured to receive a (N−4)th-stage drive signal and a first clock signal, and output an Nth-stage drive signal. A (N+1)th-stage shift register circuit is configured to receive a (N−3)th-stage drive signal and a third clock signal, and output a (N+1)th-stage drive signal. A (N+2)th-stage shift register circuit is configured to receive a (N−2)th-stage drive signal and a second clock signal, and output a (N+2)th-stage drive signal. A (N+3)th-stage shift register circuit is configured to receive a (N−1)th-stage drive signal and a fourth clock signal, and output a (N+3)th-stage drive signal. A (N+4)th-stage shift register circuit is configured to receive the Nth-stage drive signal and the third clock signal, and output a (N+4)th-stage drive signal. A (N+5)th-stage shift register circuit is configured to receive the (N+1)th-stage drive signal and the first clock signal, and output a (N+5)th-stage drive signal. A (N+6)th-stage shift register circuit is configured to receive the (N+2)th-stage drive signal and the fourth clock signal (CK4), and output a (N+6)th-stage drive signal. A (N+7)th-stage shift register circuit is configured to receive the (N+3)th-stage drive signal and the second clock signal, and output a (N+7)th-stage drive signal, where N is a positive integer greater than zero.

In some embodiments, when the display device is operated in a second mode and displays a first frame, a level change time of the first clock signal is earlier than a level change time of the third clock signal; the level change time of the third clock signal is earlier than a level change time of the second clock signal; the level change time of the second clock signal is earlier than a level change time of the fourth clock signal; a level enabling period of the third clock signal partially overlaps a level enabling period of the first clock signal; a level enabling period of the second clock signal partially overlaps the level enabling period of the third clock signal; a level enabling period of the fourth clock signal partially overlaps the level enabling period of the second clock signal; the level enabling period of the second clock signal does not overlap the level enabling period of the first clock signal; and the level enabling period of the fourth clock signal does not overlap the level enabling period of the third clock signal. When the display device is operated in a second mode and displays a second frame, the second frame is adjacent to the first frame; the level change time of the second clock signal is earlier than the level change time of the fourth clock signal; the level change time of the fourth clock signal is earlier than the level change time of the first clock signal; the level change time of the first clock signal is earlier than a level change time of the third clock signal; the level enabling period of the fourth clock signal partially overlaps the level enabling period of the second clock signal; the level enabling period of the first clock signal partially overlaps the level enabling period of the fourth clock signal; the level enabling period of the third clock signal partially overlaps the level enabling period of the first clock signal; the level enabling period of the second clock signal does not overlap the level enabling period of the first clock signal; and the level enabling period of the fourth clock signal does not overlap the level enabling period of the third clock signal.

The present disclosure further provides another gate driver embodiment, where the gate driver includes a plurality of shift register circuits. An Nth-stage shift register circuit is configured to receive a (N−2)th-stage drive signal and a first clock signal, and output an Nth-stage drive signal. A (N+1)th-stage shift register circuit is configured to receive a (N−1)th-stage drive signal and a second clock signal, and output a (N+1)th-stage drive signal. A (N+2)th-stage shift register circuit is configured to receive the Nth-stage drive signal and a third clock signal, and output a (N+2)th-stage drive signal. A (N+3)th-stage shift register circuit is configured to receive the (N+1)th-stage drive signal and a fourth clock signal, and output a (N+3)th-stage drive signal, where N is a positive integer greater than zero.

In some embodiments, when the display device is operated in a second mode and displays a first frame, a level change time of the first clock signal is earlier than a level change time of the third clock signal; and a level enabling period of the third clock signal does not overlap a level enabling period of the first clock signal. When the display device is operated in the second mode and displays a second frame, the second frame is generated subsequent to the first frame; a level change time of the second clock signal is earlier than a level change time of the fourth clock signal; and a level enabling period of the second clock signal does not overlap a level enabling period of the fourth clock signal.

The embodiments of the gate driving circuit of the present disclosure may enable, according to the foregoing clock signals, a current display device to be directly suitable for a higher frame rate. That is, the display device applying the gate driving circuit of this application may be operated in a display mode of a higher frame rate in a case in which a multiplexer component is provided and an original component configuration and design are not changed.

In order to make the aforementioned and other objectives, features, and advantages of the present disclosure more comprehensible, preferred embodiments accompanied with figures are described in detail below.

DETAILED DESCRIPTION

Figure 1:
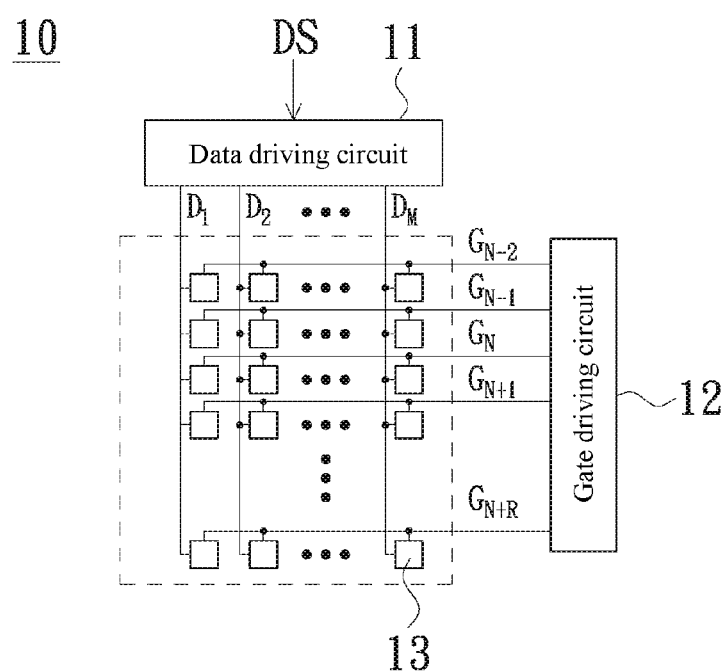
FIG. 1 is a schematic diagram of an embodiment of a display device according to the present disclosure.

First refer to FIG. 1. FIG. 1 is a schematic diagram of an embodiment of a display device 10, where the display device 10 is, for example, an electronic device such as a liquid crystal display. The display device 10 includes a data driving circuit 11, a gate driving circuit 12, and a plurality of pixels 13. The data driving circuit 11 is electrically coupled to the plurality of pixels 13, and is configured to receive a plurality of display data DS to be displayed, and output, on this basis, the same to corresponding display data lines $D_1, D_2 \ldots D_M$. The display data lines $D_1, D_2 \ldots D_M$ transmit the display data DS to the corresponding plurality of pixels 13, where M is a positive integer. The gate driving circuit 12 is electrically coupled to the plurality of pixels 13 through a plurality of gate lines, and is configured to generate a plurality of driving signals. The driving signals shown in FIG. 1 include $G_{N-2}$, $G_{N-1}, G_N, G_{N+1} \ldots G_{N+R}$, where N is a positive integer. The gate driving circuit 12 also transmits the driving signals to corresponding gate lines, so that the pixels 13 electrically coupled to the gate lines determine, according to the driving signals, whether to receive and display the foregoing display data DS.

Figure 2:
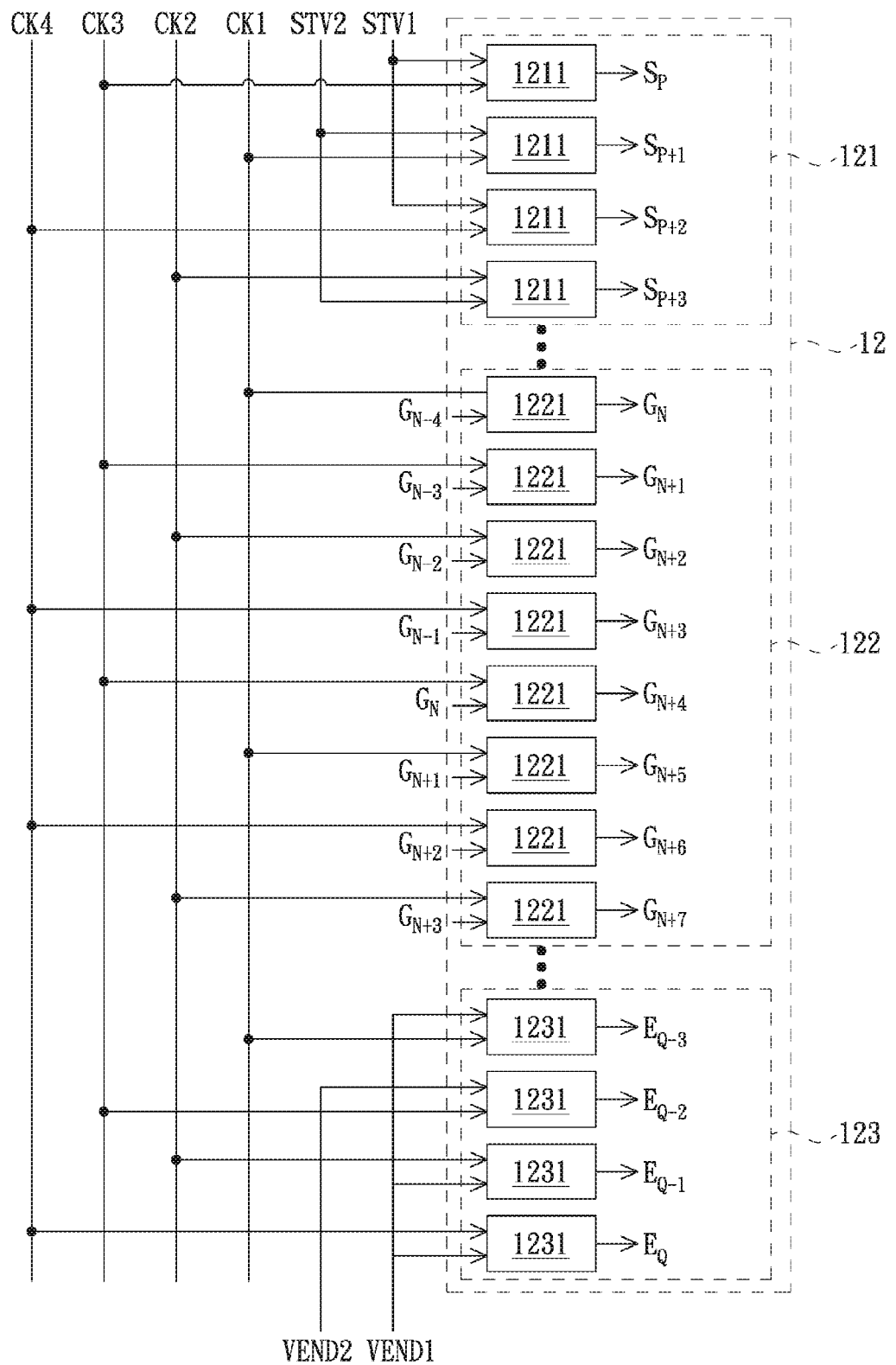
FIG. 2 is a schematic diagram of a first embodiment of a gate driving circuit according to the present disclosure.

Refer to FIG. 2. FIG. 2 is a schematic diagram of a first embodiment of the gate driving circuit 12 according to the present disclosure. The gate driving circuit 12 includes an enabling shift register circuit unit 121, a shift register circuit unit 122, and a disabling shift register circuit unit 123. The enabling shift register circuit unit 121 is configured to receive a first enabling signal STV1, a second enabling signal STV2, a first clock signal CK1, a second clock signal CK2, a third clock signal CK3, and a fourth clock signal CK4, and output a plurality of enabling driving signals according to the first enabling signal STV1 and the second enabling signal STV2. The shift register circuit unit 122 is electrically coupled to the enabling shift register circuit unit 121, and is configured to receive the foregoing plurality of enabling driving signals and the plurality of clock signals.

Using FIG. 2 as an example, the shift register circuit unit 122 is configured to receive the first clock signal CK1, the second clock signal CK2, the third clock signal CK3, and the fourth clock signal CK4, and is also configured to output the plurality of driving signals, so as to drive the corresponding pixels 13. The disabling shift register circuit unit 123 is electrically coupled to the shift register circuit unit 122, and is configured to receive a first disabling signal VEND1, a first disabling signal VEND2, the first clock signal CK1, the second clock signal CK2, the third clock signal CK3, and the fourth clock signal CK4. The disabling shift register circuit unit 123 also outputs a plurality of disabling driving signals to the shift register circuit unit 122 according to the first disabling signal VEND1 and the second disabling signal VEND2, so as to end driving of a pixel 13 of a current frame.

In this embodiment, the enabling shift register circuit unit 121 may include a plurality of shift register circuits 1211, such as a Pth-stage shift register circuit, a (P+1)th-stage shift register circuit, a (P+2)th-stage shift register circuit, and a (P+3)th-stage shift register circuit, where P is a positive integer greater than zero. The Pth-stage shift register circuit receives the first enabling signal STV1 and the third clock signal CK3. The Pth-stage shift register circuit outputs a Pth-stage enabling drive signal SP according to the third clock signal CK3, where when the third clock signal CK3 is at an enabled level, the Pth-stage enabling drive signal SP is at an enabled level. The (P+1)th-stage shift register circuit receives the second enabling signal STV2 and the first clock signal CK1. The (P+1)th-stage shift register circuit outputs a (P+1)th-stage enabling drive signal $S_{P+1}$ according to the first clock signal CK1, where when the first clock signal CK1 is at an enabled level, the (P+1)th-stage enabling drive signal $S_{P+1}$ is at an enabled level. The (P+2)th-stage shift register circuit receives the first enabling signal STV1 and the fourth clock signal CK4. The (P+2)th-stage shift register circuit outputs a (P+2)th-stage enabling drive signal $S_{P+2}$ according to the fourth clock signal CK4, where when the fourth clock signal CK4 is at an enabled level, the (P+2)th-stage enabling drive signal $S_{P+2}$ is at an enabled level. The (P+3)th-stage shift register circuit receives the second enabling signal STV2 and the second clock signal CK2. The (P+3)th-stage shift register circuit outputs a (P+3)th-stage enabling drive signal $S_{P+3}$ according to the second clock signal CK2, where when the fourth clock signal CK4 is at an enabled level, the (P+3)th-stage enabling drive signal $S_{P+3}$ is at an enabled level.

In this embodiment, the shift register circuit unit 122 includes a plurality of shift register circuits 1221, for example, at least eight shift register circuits, including an Nth-stage shift register circuit, a (N+1)th-stage shift register circuit, a (N+2)th-stage shift register circuit, a (N+3)th-stage shift register circuit, a (N+4)th-stage shift register circuit, a (N+5)th-stage shift register circuit, a (N+6)th-stage shift register circuit, and a (N+7)th-stage shift register circuit. The Nth-stage shift register circuit receives a (N−4)th-stage drive signal $G_{N-4}$ and the first clock signal CK1, and outputs an Nth-stage drive signal GN according to the first clock signal CK1. The (N+1)th-stage shift register circuit is configured to receive a (N−3)th-stage drive signal $G_{N-3}$ and the third clock signal CK3, and output a (N+1)th-stage drive signal $G_{N+1}$ according to the third clock signal CK3. The (N+2)th-stage shift register circuit is configured to receive a (N−2)th-stage drive signal $G_{N-2}$ and the second clock signal CK2, and output a (N+2)th-stage drive signal $G_{N+2}$ according to the second clock signal CK2. The (N+3)th-stage shift register circuit is configured to receive a (N−1)th-stage drive signal $G_{N-1}$ and the fourth clock signal CK4, and output a (N+3)th-stage drive signal $G_{N+3}$ according to the fourth clock signal CK4. The (N+4)th-stage shift register circuit is configured to receive the Nth-stage drive signal $G_N$ and the third clock signal CK3, and output a (N+4)th-stage drive signal $G_{N+4}$ according to the third clock signal CK3. The (N+5)th-stage shift register circuit is configured to receive the (N+1)th-stage drive signal $G_{N+1}$ and the first clock signal CK1, and output a (N+5)th-stage drive signal $G_{N+5}$ according to the first clock signal CK1. The (N+6)th-stage shift register circuit is configured to receive the (N+2)th-stage drive signal $G_{N+2}$ and the fourth clock signal CK4, and output a (N+6)th-stage drive signal $G_{N+6}$ according to the fourth clock signal CK4. The (N+7)th-stage shift register circuit is configured to receive the (N+3)th-stage drive signal $G_{N+3}$ and the second clock signal CK2, and output a (N+7)th-stage drive signal $G_{N+7}$ according to the second clock signal CK2.

In this embodiment, the disabling shift register circuit unit 123 includes a plurality of shift register circuits 1231, such as a (Q−3)th-stage shift register circuit, a (Q−2)th-stage shift register circuit, a (Q−1)th-stage shift register circuit, and a Qth-stage shift register circuit, where Q is a positive integer greater than zero. The (Q−3)th-stage shift register circuit receives the first disabling signal VEND1 and the first clock signal CK1, and outputs a (Q−3)th-stage disabling drive signal EQ−3 according to the first clock signal CK1. The (Q−2)th-stage shift register circuit receives the second disabling signal VEND2 and the third clock signal CK3, and outputs a (Q−2)th-stage disabling drive signal EQ−2 according to the third clock signal CK3. The (Q−1)th-stage shift register circuit receives the first disabling signal VEND1 and the second clock signal CK2, and outputs a (Q−1)th-stage disabling drive signal EQ−1 according to the second clock signal CK2. The Qth-stage shift register circuit receives the second disabling signal VEND2 and the fourth clock signal CK4, and outputs a Qth-stage disabling drive signal EQ according to the fourth clock signal CK4.

An embodiment of the gate driving circuit 12 of the present disclosure is further described below by using the eight shift register circuits (the Nth-stage shift register circuit, the (N+1)th-stage shift register circuit, the (N+2)th-stage shift register circuit, the (N+3)th-stage shift register circuit, the (N+4)th-stage shift register circuit, the (N+5)th-stage shift register circuit, the (N+6)th-stage shift register circuit, and the (N+7)th-stage shift register circuit in FIG. 2) included in the shift register circuit unit 122 as an example. In this embodiment, the Pth-stage shift register circuit serves as the (N−4)th-stage shift register circuit, and is configured to output the (N−4)th-stage drive signal $G_{N-4}$; the (P+1)th-stage shift register circuit serves as the (N−3)th-stage shift register circuit, and is configured to output the (N−3)th-stage drive signal $G_{N-3}$; the (P+2)th-stage shift register circuit serves as the (N−2)th-stage shift register circuit, and is configured to output the (N−2)th-stage drive signal $G_{N-2}$; and the (P+3)th-stage shift register circuit serves as the (N−1)th-stage shift register circuit, and is configured to output the (N−1)th-stage drive signal $G_{N-1}$. The (Q−3)th-stage shift register circuit serves as a (N+8)th-stage shift register circuit, and is configured to output a (N+8)th-stage drive signal $G_{N+8}$; the (Q−2)th-stage shift register circuit serves as a (N+9)th-stage shift register circuit, and is configured to output a (N+9)th-stage drive signal $G_{N+9}$; the (Q−1)th-stage shift register circuit serves as a (N+10)th-stage shift register circuit, and is configured to output a (N+10)th-stage drive signal $G_{N+10}$; and the Qth-stage shift register circuit serves as a (N+11)th-stage shift register circuit, and is configured to output a (N+11)th-stage drive signal $G_{N+11}$.

Figure 3A:
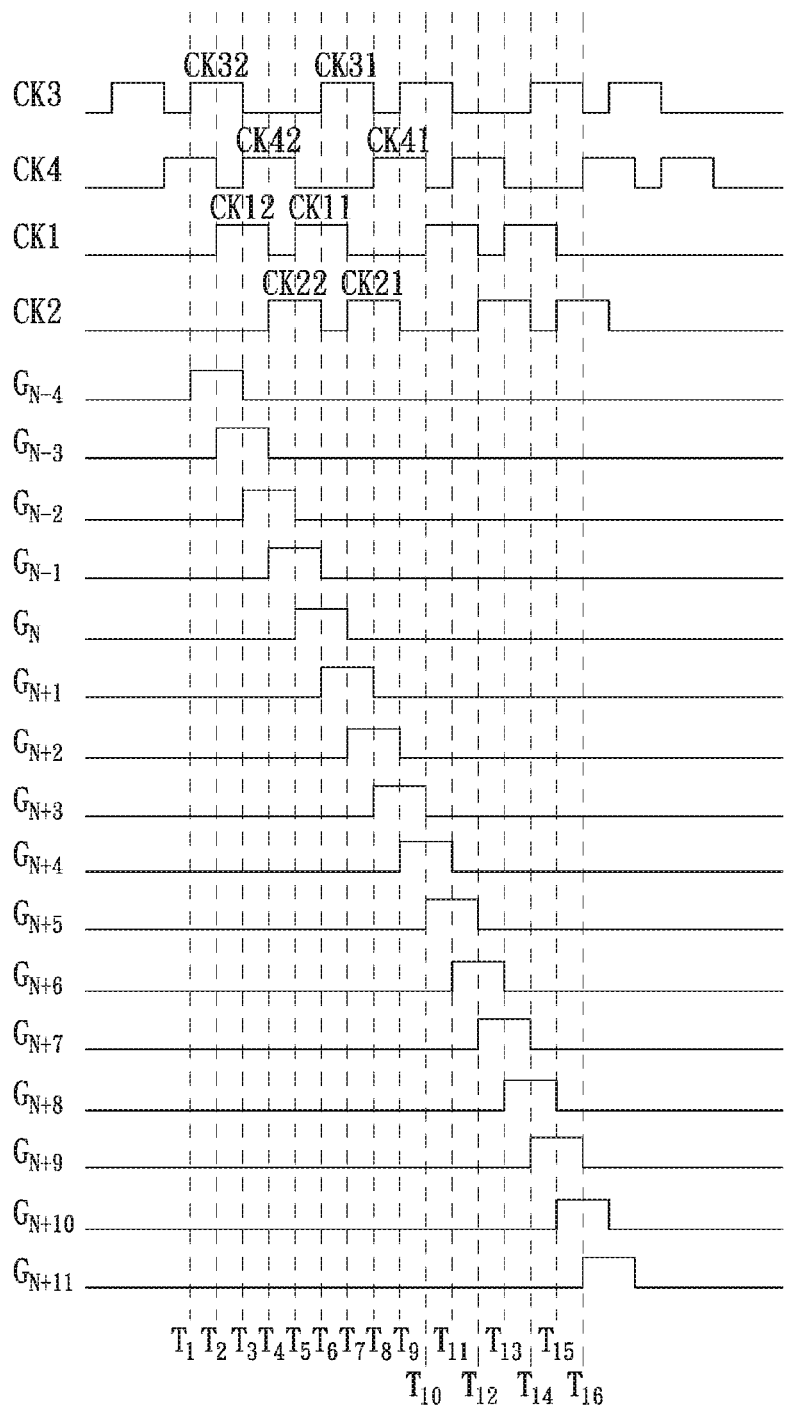
FIG. 3A is a first timing diagram of a first embodiment of a gate driving circuit according to the present disclosure.

First refer to FIG. 3A. FIG. 3A is a timing diagram of a first embodiment that the gate driving circuit 12 is operated in a first mode according to the present disclosure, where the first mode is, for example, a display mode of a frame rate of 60 HZ. Each clock signal includes a first pulse and a second pulse. A level change time of a first pulse CK11 of the first clock signal CK1 is earlier than a level change time of a first pulse CK31 of the third clock signal CK3; the level change time of the first pulse CK31 of the third clock signal CK3 is earlier than a level change time of a first pulse CK21 of the second clock signal CK2; the level change time of the first pulse CK21 of the second clock signal CK2 is earlier than a level change time of a first pulse CK42 of the fourth clock signal CK4; a level enabling period of the first pulse CK31 of the third clock signal CK3 partially overlaps a level enabling period of the first pulse CK11 of the first clock signal CK1; a level enabling period of the first pulse CK21 of the second clock signal CK2 partially overlaps the level enabling period CK31 of the first pulse CK3 of the second clock signal; a level enabling period of the first pulse CK41 of the fourth clock signal CK4 partially overlaps the level enabling period of the first pulse CK21 of the second clock signal CK2; the level enabling period of the first pulse CK21 of the second clock signal CK2 does not overlap the level enabling period of the first pulse CK11 of the first clock signal CK1; the level enabling period of the first pulse CK41 of the fourth clock signal CK4 does not overlap the level enabling period of the first pulse CK31 of the third clock signal CK3; a level change time of a second pulse CK32 of the third clock signal CK3 is earlier than a level change time of a second pulse CK12 of the first clock signal CK1; the level change time of the second pulse CK12 of the first clock signal CK1 is earlier than a level change time of a second pulse CK42 of the fourth clock signal CK4; the level change time of the second pulse CK42 of the fourth clock signal CK4 is earlier than a level change time of a second pulse CK22 of the third clock signal CK2; a level enabling period of the second pulse CK12 of the first clock signal CK1 partially overlaps a level enabling period of the second pulse CK32 of the third clock signal CK3; a level enabling period of the second pulse CK42 of the fourth clock signal CK4 partially overlaps a level enabling period of the second pulse CK12 of the first clock signal CK1; a level enabling period of the second pulse CK22 of the second clock signal CK2 partially overlaps a level enabling period of the second pulse CK42 of the fourth clock signal CK4; the level enabling period of the second pulse CK22 of the second clock signal CK2 does not overlap the level enabling period of the second pulse CK12 of the first clock signal CK1; and the level enabling period of the second pulse CK42 of the fourth clock signal CK4 does not overlap the level enabling period of the second pulse CK32 of the third clock signal CK3.

When the display device 10 is operated in the first mode and is going to display an image frame, both the first enabling signal STV1 and the second enabling signal STV2 are enabled. Therefore, the Pth-stage shift register circuit, the (P+1)th-stage shift register circuit, the (P+2)th-stage shift register circuit, and the (P+3)th-stage shift register circuit are enabled. The Pth-stage shift register circuit, at a time $T_1$, enables the (N−4)th-stage drive signal $G_{N-4}$ to be at an enabled level because of the second pulse CK32 of the third clock signal CK3; the (P+1)th-stage shift register circuit, at a time $T_2$, enables the (N−3)th-stage drive signal $G_{N-3}$ to be at an enabled level because of the second pulse CK12 of the first clock signal CK1; the (P+2)th-stage shift register circuit, at a time $T_3$, enables the (N−2)th-stage drive signal $G_{N-2}$ to be at an enabled level because of the second pulse CK42 of the fourth clock signal CK4; and the (P+3)th-stage shift register circuit, at a time $T_4$, enables the (N−1)th-stage drive signal $G_{N-1}$ to be at an enabled level because of the second pulse CK22 of the second clock signal CK2. The Nth-stage shift register circuit is enabled because of the (N−4)th-stage drive signal $G_{N-4}$. At a time $T_5$, when the first clock signal CK1 is the first pulse CK11, the Nth-stage shift register circuit enables the Nth-stage drive signal $G_N$ to be at an enabled level. The (N+1)th-stage shift register circuit is enabled because of the (N−3)th-stage drive signal $G_{N-3}$. At a time $T_6$, when the third clock signal CK3 is the first pulse CK31, the (N+1)th-stage shift register circuit enables the (N+1)th-stage drive signal $G_{N+1}$ to be at an enabled level. The (N+2)th-stage shift register circuit is enabled because of the (N−2)th-stage drive signal $G_{N-2}$. At a time $T_7$, when the second clock signal CK2 is the first pulse CK21, the (N+2)th-stage shift register circuit enables the (N+2)th-stage drive signal $G_{N+2}$ to be at an enabled level. The (N+3)th-stage shift register circuit is enabled because of the (N−1)th-stage drive signal $G_{N-1}$. At a time $T_8$, when the fourth clock signal CK4 is the first pulse CK41, the (N+3)th-stage shift register circuit enables the (N+3)th-stage drive signal $G_{N+3}$ to be at an enabled level. The (N+4)th-stage shift register circuit is enabled because of the Nth-stage drive signal $G_N$. At a time $T_9$, when the third clock signal CK3 is the second pulse CK32, the (N+4)th-stage shift register circuit enables the (N+4)th-stage drive signal $G_{N+4}$ to be at an enabled level. The (N+5)th-stage shift register circuit is enabled because of the (N+1)th-stage drive signal $G_{N+1}$. At a time $T_{10}$, when the first clock signal CK1 is the second pulse CK12, the (N+5)th-stage shift register circuit enables the (N+5)th-stage drive signal $G_{N+5}$ to be at an enabled level. At a time $T_{11}$, the (N+6)th-stage shift register circuit is enabled because of the (N+2)th-stage drive signal $G_{N+2}$. When the fourth clock signal CK4 is the second pulse CK42, the (N+6)th-stage shift register circuit enables the (N+6)th-stage drive signal $G_{N+6}$ to be at an enabled level. The (N+7)th-stage shift register circuit is enabled because of the (N+3)th-stage drive signal $G_{N+3}$. At a time $T_{12}$, when the second clock signal CK2 is the second pulse CK22, the (N+7)th-stage shift register circuit enables the (N+7)th-stage drive signal $G_{N+7}$ to be at an enabled level.

Therefore, a level change time of the Nth-stage drive signal $G_N$ is earlier than a level change time of the (N+1)th-stage drive signal $G_{N+1}$; the level change time of the (N+1)th-stage drive signal $G_{N+1}$ is earlier than a level change time of the (N+2)th-stage drive signal $G_{N+2}$; the level change time of the (N+2)th-stage drive signal $G_{N+2}$ is earlier than a level change time of the (N+3)th-stage drive signal $G_{N+3}$; the level change time of the (N+3)th-stage drive signal $G_{N+3}$ is earlier than a level change time of the (N+4)th-stage drive signal $G_{N+4}$; the level change time of the (N+4)th-stage drive signal $G_{N+4}$ is earlier than a level change time of the (N+5)th-stage drive signal $G_{N+5}$; the level change time of the (N+5)th-stage drive signal $G_{N+5}$ is earlier than a level change time of the (N+6)th-stage drive signal $G_{N+6}$; the level change time of the (N+6)th-stage drive signal $G_{N+6}$ is earlier than a level change time of the (N+7)th-stage drive signal $G_{N+7}$; a level enabling period of the (N+1)th-stage drive signal $G_{N+1}$ partially overlaps a level enabling period of the Nth-stage drive signal $G_N$; a level enabling period of the (N+2)th-stage drive signal $G_{N+2}$ partially overlaps the level enabling period of the (N+1)th-stage drive signal $G_{N+1}$; a level enabling period of the (N+3)th-stage drive signal $G_{N+3}$ partially overlaps the level enabling period of the (N+2)th-stage drive signal $G_{N+2}$; a level enabling period of the (N+4)th-stage drive signal $G_{N+4}$ partially overlaps the level enabling period of the (N+3)th-stage drive signal $G_{N+3}$; a level enabling period of the (N+5)th-stage drive signal $G_{N+5}$ partially overlaps the level enabling period of the (N+4)th-stage drive signal $G_{N+4}$; a level enabling period of the (N+6)th-stage drive signal $G_{N+6}$ partially overlaps the level enabling period of the (N+5)th-stage drive signal $G_{N+5}$; and a level enabling period of the (N+7)th-stage drive signal $G_{N+7}$ partially overlaps the level enabling period of the (N+6)th-stage drive signal $G_{N+6}$.

The (Q−3)th-stage shift register circuit, the (Q−2)th-stage shift register circuit, the (Q−1)th-stage shift register circuit, and the Qth-stage shift register circuit are enabled because of the first disabling signal VEND1 and the second disabling signal VEND2. At a time $T_{13}$, the (Q−3)th-stage shift register circuit enables the (N+8)th-stage drive signal $G_{N+8}$ to be at an enabled level because the first clock signal CK1 is the second pulse CK12, where the (N+8)th-stage drive signal $G_{N+8}$ is transmitted to a (N+4)th-stage shift register, so as to turn off the (N+4)th-stage shift register. At a time $T_{14}$, the (Q−2)th-stage shift register circuit enables the (N+9)th-stage drive signal $G_{N+9}$ to be at an enabled level because the third clock signal CK3 is the second pulse CK32, where the (N+9)th-stage drive signal $G_{N+9}$ is transmitted to a (N+5)th-stage shift register, so as to turn off the (N+5)th-stage shift register. At a time $T_{15}$, the (Q−1)th-stage shift register circuit enables the (N+10)th-stage drive signal $G_{N+10}$ to be at an enabled level because the second clock signal CK2 is the second pulse CK22, where the (N+10)th-stage drive signal $G_{N+10}$ is transmitted to a (N+6)th-stage shift register, so as to turn off the (N+6)th-stage shift register. At a time $T_{16}$, the Qth-stage shift register circuit enables the (N+11)th-stage drive signal $G_{N+11}$ to be at an enabled level because the fourth clock signal CK4 is the second pulse CK42, where the (N+11)th-stage drive signal $G_{N+11}$ is transmitted to a (N+7)th-stage shift register, so as to turn off the (N+7)th-stage shift register, and complete pixel driving of a single frame in the first mode.

Figure 3B:
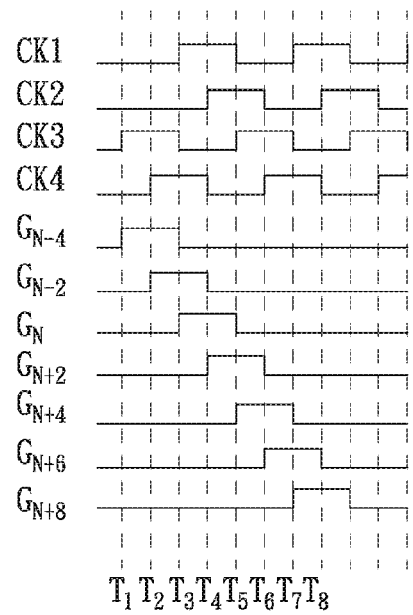
FIG. 3B is a second timing diagram of a first embodiment of a gate driving circuit according to the present disclosure.

Subsequently, refer to FIG. 3B again. FIG. 3B shows that the gate driving circuit 12 according to the first embodiment of the present disclosure is operated in the second mode, and is a timing diagram showing the first frame. The second mode is, for example, an HFR display mode, the frame rate is, for example, 144 HZ. The first frame is one of an odd frame and an even frame. In FIG. 3B, a level change time of the first clock signal CK1 is earlier than a level change time of the second clock signal CK2; the level change time of the second clock signal CK2 is earlier than a level change time of the third clock signal CK3; and the level change time of the third clock signal CK3 is earlier than a level change time of the fourth clock signal CK4. A level enabling period of the second clock signal CK2 partially overlaps a level enabling period of the first clock signal CK1; a level enabling period of the third clock signal CK3 partially overlaps the level enabling period of the second clock signal CK2; a level enabling period of the fourth clock signal CK4 partially overlaps the level enabling period of the third clock signal CK3; the level enabling period of the third clock signal CK3 does not overlap the level enabling period of the first clock signal CK1; and the level enabling period of the fourth clock signal CK4 does not overlap the level enabling period of the second clock signal CK2. Using the first clock signal CK1 being the foremost as an example, the first clock signal CK1, the second clock signal CK2, the third clock signal CK3, and the fourth clock signal CK4 are cyclically enabled.

Therefore, when the display device 10 is operated in the second mode and displays the first frame, the first enabling signal STV1 is enabled, the second enabling signal STV2 is disabled, the Pth-stage shift register circuit and the (P+2)th-stage shift register circuit are enabled, and the (P+1)th-stage shift register circuit and the (P+3)th-stage shift register circuit are disabled. At the time $T_1$, the Pth-stage shift register circuit enables the (N−4)th-stage drive signal $G_{N-4}$ to be at an enabled level because the third clock signal CK3 is enabled. At the time $T_2$, the (P+2)th-stage shift register circuit enables the (N−2)th-stage drive signal $G_{N-2}$ to be at an enabled level because the fourth clock signal CK4 is enabled. The Nth-stage shift register circuit is enabled because of the (N−4)th-stage drive signal $G_{N-4}$. At the time $T_3$, when the first clock signal CK1 is at an enabled voltage level, the Nth-stage drive signal $G_N$ outputted by the Nth-stage shift register circuit is also at the enabled voltage level. The (N+1)th-stage shift register circuit is disabled because of the (N−3)th-stage drive signal $G_{N-3}$. The (N+2)th-stage shift register circuit is enabled because of the (N−2)th-stage drive signal $G_{N-2}$. At the time $T_4$, when the second clock signal CK2 is at the enabled voltage level, the (N+2)th-stage drive signal $G_{N+2}$ outputted by the (N+2)th-stage shift register circuit is also at the enabled voltage level. The (N+3)th-stage shift register circuit is disabled because of the (N−1)th-stage drive signal $G_{N-1}$. The (N+4)th-stage shift register circuit is enabled because of the Nth-stage drive signal $G_N$. At the time $T_5$, the third clock signal CK3 is at the enabled voltage level, and the (N+4)th-stage drive signal $G_{N+4}$ outputted by the (N+4)th-stage shift register circuit is also at the enabled voltage level. The (N+5)th-stage shift register circuit is disabled because of the (N+1)th-stage drive signal $G_{N+1}$. The (N+6)th-stage shift register circuit is enabled because of the (N+2)th-stage drive signal $G_{N+2}$. At the time $T_6$, the fourth clock signal CK4 is at the enabled voltage level, and the (N+6)th-stage drive signal $G_{N+6}$ outputted by the (N+6)th-stage shift register circuit is also at the enabled voltage level. The (N+7)th-stage shift register circuit is disabled because of the (N+3)th-stage drive signal $G_{N+3}$.

Therefore, when the display device 10 is operated in the second mode and displays the first frame, the level change time of the Nth-stage drive signal $G_N$ is earlier than the level change time of the (N+2)th-stage drive signal $G_{N+2}$; the level change time of the (N+2)th-stage drive signal $G_{N+2}$ is earlier than the level change time of the (N+4)th-stage drive signal $G_{N+4}$; the level change time of the (N+4)th-stage drive signal $G_{N+4}$ is earlier than the level change time of the (N+6)th-stage drive signal $G_{N+6}$; the level enabling period of the (N+2)th-stage drive signal $G_{N+2}$ partially overlaps the level enabling period of the Nth-stage drive signal $G_N$; the level enabling period of the (N+4)th-stage drive signal $G_{N+4}$ partially overlaps the level enabling period of the (N+2)th-stage drive signal $G_{N+2}$; and the level enabling period of the (N+6)th-stage drive signal $G_{N+6}$ partially overlaps the level enabling period of the (N+4)th-stage drive signal $G_{N+4}$.

The (Q−3)th-stage shift register circuit and the (Q−1)th-stage shift register circuit are enabled because of the first disabling signal VEND1, and the (Q−2)th-stage shift register circuit and the Qth-stage shift register circuit are disabled because of the second disabling signal VEND2. At the time $T_7$, the (Q−3)th-stage shift register circuit enables the (N+8)th-stage drive signal $G_{N+8}$ to be also at the enabled voltage level because the first clock signal CK1 is at the enabled voltage level, where the (N+8)th-stage drive signal $G_{N+8}$ is transmitted to the (N+4)th-stage shift register, so as to turn off the (N+4)th-stage shift register. At the time $T_8$, the (Q−1)th-stage shift register circuit enables the (N+10)th-stage drive signal $G_{N+10}$ to be also at the enabled voltage level because the second clock signal CK2 is at the enabled voltage level, where the (N+10)th-stage drive signal $G_{N+10}$ is transmitted to the (N+6)th-stage shift register, so as to turn off the (N+6)th-stage shift register, and complete pixel driving of the first frame.

Figure 3C:
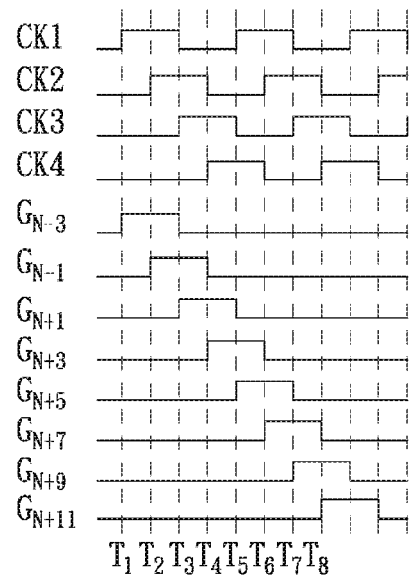
FIG. 3C is a third timing diagram of a first embodiment of a gate driving circuit according to the present disclosure.

Refer to FIG. 3C again. FIG. 3C shows that the gate driving circuit 12 according to the first embodiment of the present disclosure is operated in the second mode, and is a timing diagram showing the second frame. The second frame is another one of the odd frame and the even frame, and the second frame and the first frame are adjacent image frames at a display time. In FIG. 3C, the level change time of the third clock signal CK3 is earlier than the level change time of the fourth clock signal CK4; the level change time of the fourth clock signal CK4 is earlier than the level change time of the first clock signal CK1; and the level change time of the first clock signal CK1 is earlier than the level change time of the second clock signal CK2. The level enabling period of the fourth clock signal CK4 partially overlaps the level enabling period of the third clock signal CK3; the level enabling period of the first clock signal CK1 partially overlaps the level enabling period of the fourth clock signal CK4; the level enabling period of the second clock signal CK2 partially overlaps the level enabling period of the first clock signal CK1; the level enabling period of the third clock signal CK3 does not overlap the level enabling period of the first clock signal CK1; and the level enabling period of the fourth clock signal CK4 does not overlap the level enabling period of the second clock signal CK2.

When the display device 10 is operated in the second mode and displays the second frame, the first enabling signal STV1 is disabled, and the second enabling signal STV2 is enabled. Therefore, the Pth-stage shift register circuit and the (P+2)th-stage shift register circuit are disabled, and the (P+1)th-stage shift register circuit and the (P+3)th-stage shift register circuit are enabled. At the time $T_1$, the (P+1)th-stage shift register circuit enables the outputted (N−3)th-stage drive signal $G_{N-3}$ to be also at the enabled voltage level because the first clock signal CK1 is at the enabled voltage level. At the time $T_2$, the (P+3)th-stage shift register circuit enables the outputted (N−1)th-stage drive signal $G_{N-1}$ to be also at the enabled voltage level because the second clock signal CK2 is at the enabled voltage level. The Nth-stage shift register circuit is disabled because of the (N−4)th-stage drive signal $G_{N-4}$. The (N+1)th-stage shift register circuit is enabled because of the (N−3)th-stage drive signal $G_{N-3}$. At the time $T_3$, when the third clock signal CK3 is at the enabled voltage level, the (N+1)th-stage drive signal $G_{N+1}$ of the (N+1)th-stage shift register circuit is also at the enabled voltage level. The (N+2)th-stage shift register circuit is disabled because of the (N−2)th-stage drive signal $G_{N-2}$. The (N+3)th-stage shift register circuit is enabled because of the (N−1)th-stage drive signal $G_{N-1}$. At the time $T_4$, when the fourth clock signal CK4 is at the enabled voltage level, the (N+3)th-stage drive signal $G_{N+3}$ of the (N+3)th-stage shift register circuit is also at the enabled voltage level. The (N+4)th-stage shift register circuit is disabled because of the Nth-stage drive signal $G_N$. The (N+5)th-stage shift register circuit is enabled because of the (N+1)th-stage drive signal $G_{N+1}$. At the time $T_5$, when the first clock signal CK1 is at the enabled voltage level, the (N+5)th-stage drive signal $G_{N+5}$ of the (N+5)th-stage shift register circuit is also at the enabled voltage level. The (N+6)th-stage shift register circuit is disabled because of the (N+2)th-stage drive signal $G_{N+2}$. The (N+7)th-stage shift register circuit is enabled because of the (N+3)th-stage drive signal $G_{N+3}$. At the time $T_6$, when the second clock signal CK2 is at the enabled voltage level, the (N+7)th-stage drive signal $G_{N+7}$ of the (N+7)th-stage shift register circuit is also at the enabled voltage level.

Therefore, when the display device 10 is operated in the second mode and displays the second frame, the level change time of the (N+1)th-stage drive signal $G_{N+1}$ is earlier than the level change time of the (N+3)th-stage drive signal $G_{N+3}$; the level change time of the (N+3)th-stage drive signal $G_{N+3}$ is earlier than the level change time of the (N+5)th-stage drive signal $G_{N+5}$; the level change time of the (N+5)th-stage drive signal $G_{N+5}$ is earlier than the level change time of the (N+7)th-stage drive signal $G_{N+7}$; the level enabling period of the (N+3)th-stage drive signal $G_{N+3}$ partially overlaps the level enabling period of the (N+1)th-stage drive signal $G_{N+1}$; the level enabling period of the (N+5)th-stage drive signal $G_{N+5}$ partially overlaps the level enabling period of the (N+3)th-stage drive signal $G_{N+3}$; and the level enabling period of the (N+7)th-stage drive signal $G_{N+7}$ partially overlaps the level enabling period of the (N+5)th-stage drive signal $G_{N+5}$.

The (Q−3)th-stage shift register circuit and the (Q−1)th-stage shift register circuit are disabled because of the first disabling signal VEND1, and the (Q−2)th-stage shift register circuit and the Qth-stage shift register circuit are enabled because of the second disabling signal VEND2. At the time $T_7$, the (Q−2)th-stage shift register circuit enables the outputted (N+9)th-stage drive signal $G_{N+9}$ to be at the enabled voltage level because the third clock signal CK3 is at the enabled voltage level, where the (N+9)th-stage drive signal $G_{N+9}$ is transmitted to the (N+5)th-stage shift register, so as to turn off the (N+5)th-stage shift register. At the time $T_8$, the Qth-stage shift register circuit enables the outputted (N+11)th-stage drive signal $G_{N+11}$ to be at the enabled voltage level because the fourth clock signal CK4 is at the enabled voltage level, where the (N+11)th-stage drive signal $G_{N+11}$ is transmitted to the (N+7)th-stage shift register, so as to turn off the (N+7)th-stage shift register, and complete pixel driving of the second frame. The pixel rows driven by the first frame and the second frame are different, and the pixel rows driven by the first frame and the second frame are adjacent. Therefore, when the display device 10 is operated in the second mode, only some of the pixel rows to be displayed are driven when displaying each frame, and adjacent frames drive different pixel rows. In this embodiment, using driving a half of the pixel rows to be displayed as an example, the HFR display mode is simulated.

Figure 4:
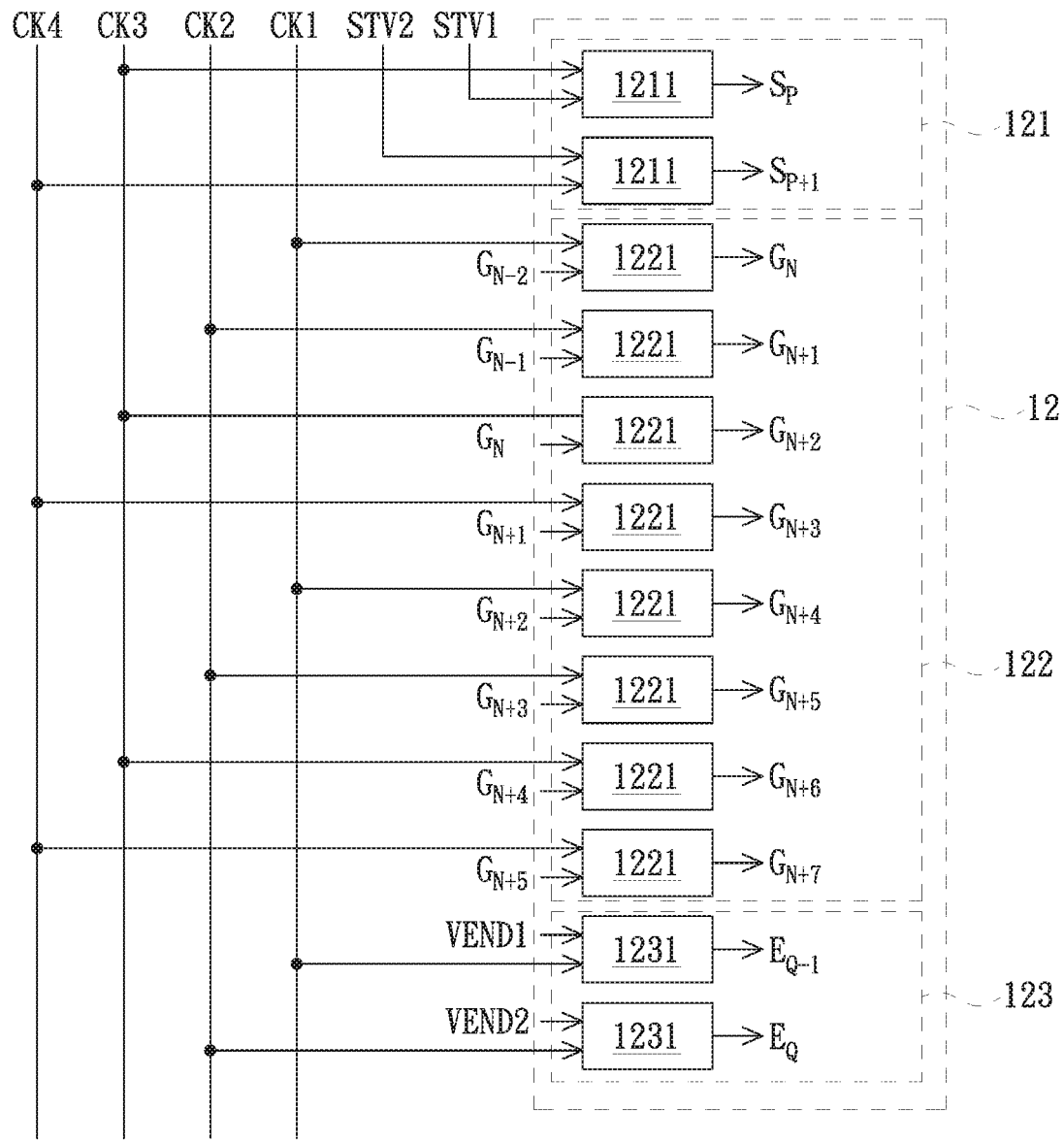
FIG. 4 is a schematic diagram of a second embodiment of a gate driving circuit according to the present disclosure.

Refer to FIG. 4. FIG. 4 is a schematic diagram of a second embodiment of the gate driving circuit 12 according to present disclosure. In this embodiment, the first clock signal CK1, a second clock signal CK2, a third clock signal CK3, the fourth clock signal CK4, the first enabling signal STV1, the second enabling signal STV2, the first disabling signal VEND1, and the second disabling signal VEND2 are included. The enabling shift register circuit unit 121 may include the Pth-stage shift register circuit and the (P+1)th-stage shift register circuit, where P is a positive integer greater than zero. The Pth-stage shift register circuit receives the first enabling signal STV1 and the third clock signal CK3. The Pth-stage shift register circuit outputs the Pth-stage enabling drive signal $S_P$ according to the third clock signal CK3, where when the third clock signal CK3 is enabled, the Pth-stage enabling drive signal $S_P$ is enabled. The (P+1)th-stage shift register circuit receives the second enabling signal STV2 and the fourth clock signal CK4. The (P+1)th-stage shift register circuit outputs the (P+1)th-stage enabling drive signal $S_{P+1}$ according to the fourth clock signal CK4, where when the fourth clock signal CK4 is enabled, the (P+1)th-stage enabling drive signal $S_{P+1}$ is enabled.

In this embodiment, the shift register circuit unit 122 includes at least four shift register circuits 1221. In FIG. 4, including eight shift register circuits is used as an example, but is not limited thereto. The shift register circuit unit 122 includes the Nth-stage shift register circuit, the (N+1)th-stage shift register circuit, the (N+2)th-stage shift register circuit, the (N+3)th-stage shift register circuit, the (N+4)th-stage shift register circuit, the (N+5)th-stage shift register circuit, the (N+6)th-stage shift register circuit, and the (N+7)th-stage shift register circuit. The Nth-stage shift register circuit receives the (N−2)th-stage drive signal $G_{N-2}$ and the first clock signal CK1, and outputs the Nth-stage drive signal $G_N$ according to the first clock signal CK1. The (N+1)th-stage shift register circuit is configured to receive a (N−1)th-stage drive signal $G_{N-1}$ and the second clock signal CK2, and output the (N+1)th-stage drive signal $G_{N+1}$ according to the second clock signal CK2. The (N+2)th-stage shift register circuit is configured to receive the Nth-stage drive signal $G_N$ and the third clock signal CK3, and output the (N+2)th-stage drive signal $G_{N+2}$ according to the third clock signal CK3. The (N+3)th-stage shift register circuit is configured to receive the (N+1)th-stage drive signal $G_{N+1}$ and the fourth clock signal CK4, and output the (N+3)th-stage drive signal $G_{N+3}$ according to the fourth clock signal CK4. The (N+4)th-stage shift register circuit is configured to receive the (N+2)th-stage drive signal $G_{N+2}$ and the first clock signal CK1, and output the (N+4)th-stage drive signal $G_{N+4}$ according to the first clock signal CK1. The (N+5)th-stage shift register circuit is configured to receive the (N+3)th-stage drive signal $G_{N+3}$ and the second clock signal CK2, and output the (N+5)th-stage drive signal $G_{N+5}$ according to the second clock signal CK2. The (N+6)th-stage shift register circuit is configured to receive the (N+4)th-stage drive signal $G_{N+4}$ and the third clock signal CK3, and output the (N+6)th-stage drive signal $G_{N+6}$ according to the third clock signal CK3. The (N+7)th-stage shift register circuit is configured to receive the (N+5)th-stage drive signal $G_{N+5}$ and the fourth clock signal CK4, and output the (N+7)th-stage drive signal $G_{N+7}$ according to the fourth clock signal CK4.

In this embodiment, the disabling shift register circuit unit 123 includes the (Q−1)th-stage shift register circuit and the Qth-stage shift register circuit, where Q is a positive integer greater than zero. The (Q−1)th-stage shift register circuit receives the first disabling signal VEND1 and the first clock signal CK1, and outputs the (Q−1)th-stage disabling drive signal $E_{Q-1}$ according to the first clock signal CK1. The Qth-stage shift register circuit receives the second disabling signal VEND2 and the fourth clock signal CK4, and outputs the Qth-stage disabling drive signal $E_Q$ according to the second clock signal CK2.

An operating manner of the second embodiment of the gate driving circuit 12 according to the present disclosure is further described using FIG. 4 as an example. In this embodiment, the Pth-stage shift register circuit serves as the (N−2)th-stage shift register circuit, the (P+1)th-stage shift register circuit serves as the (N−1)th-stage shift register circuit, the (Q−1)th-stage shift register circuit serves as the (N+8)th-stage shift register circuit, and the Qth-stage shift register circuit serves as the (N+9)th-stage shift register circuit.

Figure 5A:
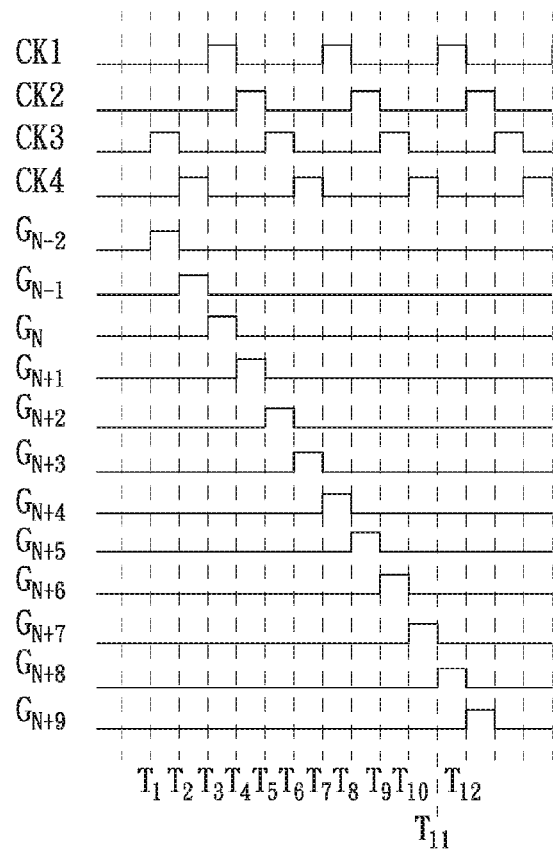
FIG. 5A is a first timing diagram of a second embodiment of a gate driving circuit according to the present disclosure.

First refer to FIG. 5A. FIG. 5A is a timing diagram that the gate driving circuit 12 is operated in the first mode according to the second embodiment of the present disclosure. In FIG. 5A, the level change time of the first clock signal CK1 is earlier than the second clock signal CK2; the level change time of the second clock signal CK2 is earlier than the third clock signal CK3; and the level change time of the third clock signal CK3 is earlier than the fourth clock signal CK4. The level enabling period of the second clock signal CK2 does not overlap the level enabling period of the first clock signal CK1; the level enabling period of the third clock signal CK3 does not overlap the level enabling period of the second clock signal CK2; and the level enabling period of the fourth clock signal CK4 does not overlap the level enabling period of the third clock signal CK3.

When the display device 10 is operated in the first mode and is going to display the image frame, both the first enabling signal STV1 and the second enabling signal STV2 are enabled. Therefore, the Pth-stage shift register circuit and the (P+1)th-stage shift register circuit are enabled. At the time $T_1$, the Pth-stage shift register circuit enables the outputted (N−2)th-stage drive signal $G_{N-2}$ to be at the enabled voltage level because the third clock signal CK3 is at the enabled voltage level. At the time $T_2$, the (P+1)th-stage shift register circuit enables the outputted (N−1)th-stage drive signal $G_{N-1}$ to be at the enabled voltage level because the fourth clock signal CK4 is at the enabled voltage level. The Nth-stage shift register circuit is enabled because of the (N−2)th-stage drive signal $G_{N-2}$. At the time $T_3$, when the first clock signal CK1 is at the enabled voltage level, the Nth-stage drive signal $G_N$ outputted by the Nth-stage shift register circuit is at the enabled voltage level. The (N+1)th-stage shift register circuit is enabled because of the (N−1)th-stage drive signal $G_{N-1}$. At the time $T_4$, when the second clock signal CK2 is at the enabled voltage level, the (N+1)th-stage drive signal $G_{N-Fi}$ of the (N+1)th-stage shift register circuit is at the enabled voltage level. The (N+2)th-stage shift register circuit is enabled because of the Nth-stage drive signal $G_N$. At the time $T_5$, when the third clock signal CK3 is at the enabled voltage level, the (N+2)th-stage drive signal $G_{N+2}$ outputted by the (N+2)th-stage shift register circuit is at the enabled voltage level. The (N+3)th-stage shift register circuit is enabled because of the (N+1)th-stage drive signal $G_{N-Fi}$. At the time $T_6$, when the fourth clock signal CK4 is at the enabled voltage level, the (N+3)th-stage drive signal $G_{N+3}$ outputted by the (N+3)th-stage shift register circuit is at the enabled voltage level. The (N+4)th-stage shift register circuit, the (N+5)th-stage shift register circuit, the (N+6)th-stage shift register circuit, and the (N+7)th-stage shift register circuit are enabled by the (N+2) th-stage drive signal $G_{N+2}$, the (N+3)th-stage drive signal $G_{N+3}$, the (N+4)th-stage drive signal $G_{N+4}$, and the (N+5) th-stage drive signal $G_{N+5}$ in a manner same to the above, and circulate at the time $T_7$, time $T_8$, time $T_9$, and time $T_{10}$, so that the outputted (N+4)th-stage drive signal $G_{N+4}$, (N+5) th-stage drive signal $G_{N+5}$, (N+6)th-stage drive signal $G_{N+6}$, and (N+7)th-stage drive signal $G_{N+7}$ are at the enabled voltage level.

Therefore, in this embodiment, the level change time of the Nth-stage drive signal $G_N$ is earlier than the level change time of the (N+1)th-stage drive signal $G_{N+1}$; the level change time of the (N+1)th-stage drive signal $G_{N+1}$ is earlier than the level change time of the (N+2)th-stage drive signal $G_{N+2}$; and the level change time of the (N+2)th-stage drive signal $G_{N+2}$ is earlier than the level change time of the (N+3)th-stage drive signal $G_{N+3}$. The level enabling period of the (N+1)th-stage drive signal $G_{N+1}$ does not overlap the level enabling period of the Nth-stage drive signal $G_N$; the level enabling period of the (N+2)th-stage drive signal $G_{N+2}$ does not overlap the level enabling period of the (N+1)th-stage drive signal $G_{N+1}$; and the level enabling period of the (N+3)th-stage drive signal $G_{N+3}$ does not overlap the level enabling period of the (N+2)th-stage drive signal $G_{N+2}$.

The (Q−1)th-stage shift register circuit and the Qth-stage shift register circuit are enabled because of the first disabling signal VEND1 and the second disabling signal VEND2. At the time $T_{11}$, the (Q−1)th-stage shift register circuit enables the outputted (N+8)th-stage drive signal $G_{N+8}$ to be at the enabled voltage level because the first clock signal CK1 is at the enabled voltage level, where the (N+8)th-stage drive signal $G_{N+8}$ is transmitted to the (N+6)th-stage shift register, so as to turn off the (N+6)th-stage shift register. At the time $T_{12}$, the Qth-stage shift register circuit enables the outputted (N+9)th-stage drive signal $G_{N+9}$ to be at the enabled voltage level because the second clock signal CK2 is at the enabled voltage level, where the (N+9)th-stage drive signal $G_{N+9}$ is transmitted to the (N+7)th-stage shift register, so as to turn off the (N+7)th-stage shift register, and complete pixel driving of a single frame.

Figure 5B:
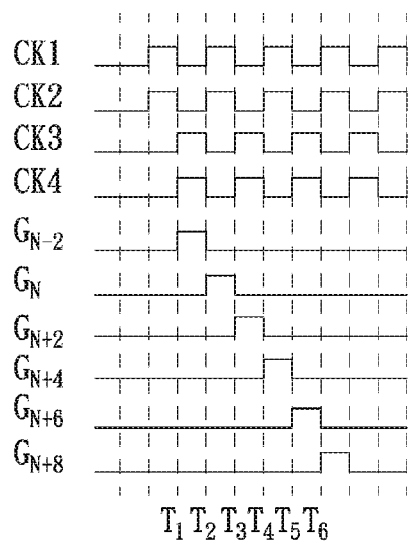
FIG. 5B is a third timing diagram of a second embodiment of a gate driving circuit according to the present disclosure.

Refer to FIG. 5B again. FIG. 5B shows that the gate driving circuit 12 according to the second embodiment of the present disclosure is operated in the second mode, and is a timing diagram showing the first frame. The first frame is one of the odd frame and the even frame. In FIG. 5B, the level change time of the first clock signal CK1 is earlier than the level change time of the third clock signal CK3; and the level enabling period of the third clock signal CK3 does not overlap the level enabling period of the first clock signal CK1. In this embodiment, the second clock signal CK2 and the first clock signal CK1 may have the same timing, and the fourth clock signal CK4 and the third clock signal CK3 may have the same timing.

Therefore, when the display device 10 is operated in the second mode and displays the first frame, the first enabling signal STV1 is enabled, the second enabling signal STV2 is disabled, the Pth-stage shift register circuit is enabled, and the (P+1)th-stage shift register circuit is disabled. At the time $T_1$, the Pth-stage shift register circuit enables the outputted (N−2)th-stage drive signal $G_{N-2}$ to be at the enabled voltage level because the third clock signal CK3 is at the enabled voltage level. The Nth-stage shift register circuit is enabled because of the (N−2)th-stage drive signal $G_{N-2}$. At the time $T_2$, when the first clock signal CK1 is at the enabled voltage level, the Nth-stage drive signal $G_N$ outputted by the Nth-stage shift register circuit is at the enabled voltage level. The (N+1)th-stage shift register circuit is disabled because of the (N−1)th-stage drive signal $G_{N-1}$. The (N+2)th-stage shift register circuit is enabled because of the Nth-stage drive signal $G_N$. At the time $T_3$, when the third clock signal CK3 is at the enabled voltage level, the (N+2)th-stage drive signal $G_{N+2}$ outputted by the (N+2)th-stage shift register circuit is at the enabled voltage level. The (N+3)th-stage shift register circuit is disabled because of the (N+1)th-stage drive signal $G_{N+1}$. The (N+4)th-stage shift register circuit is enabled because of the (N+2)th-stage drive signal $G_{N+2}$. At the time $T_4$, when the first clock signal CK1 is at the enabled voltage level, the (N+4)th-stage drive signal $G_{N+4}$ outputted by the (N+4)th-stage shift register circuit is at the enabled voltage level. The (N+5)th-stage shift register circuit is disabled because of the (N+3)th-stage drive signal $G_{N+3}$. The (N+6) th-stage shift register circuit is enabled because of the (N+4)th-stage drive signal $G_{N+4}$. At the time $T_5$, when the third clock signal CK3 is at the enabled voltage level, the (N+6)th-stage drive signal $G_{N+6}$ outputted by the (N+6)th-stage shift register circuit is at the enabled voltage level. The (N+7)th-stage shift register circuit is disabled because of the (N+5)th-stage drive signal $G_{N+5}$.

Therefore, in this embodiment, the level change time of the Nth-stage drive signal $G_N$ is earlier than the level change time of the (N+2)th-stage drive signal $G_{N+2}$; the level change time of the (N+2)th-stage drive signal $G_{N+2}$ is earlier than the level change time of the (N+4)th-stage drive signal $G_{N+4}$; the level enabling period of the (N+2)th-stage drive signal $G_{N+2}$ does not overlap the level enabling period of the Nth-stage drive signal $G_N$; and the level enabling period of the (N+4)th-stage drive signal $G_{N+4}$ does not overlap the level enabling period of the (N+2)th-stage drive signal $G_{N+2}$. The (N+1)th-stage drive signal $G_{N+1}$, the (N+3)th-stage drive signal $G_{N+3}$, the (N+5)th-stage drive signal $G_{N+5}$, and the (N+7)th-stage drive signal $G_{N+7}$ are disabled.

The (Q−1)th-stage shift register circuit is enabled because of the first disabling signal VEND1, and the Qth-stage shift register circuit is disabled because of the second disabling signal VEND2. At the time $T_6$, The (Q−1)th-stage shift register circuit outputs the (N+8)th-stage drive signal $G_{N+8}$ because the first clock signal CK1 is at the enabled voltage level, where the (N+8)th-stage drive signal $G_{N+8}$ is transmitted to the (N+6)th-stage shift register, so as to turn off the (N+6)th-stage shift register. In this way, the pixel driving of the first frame is completed.

Figure 5C:
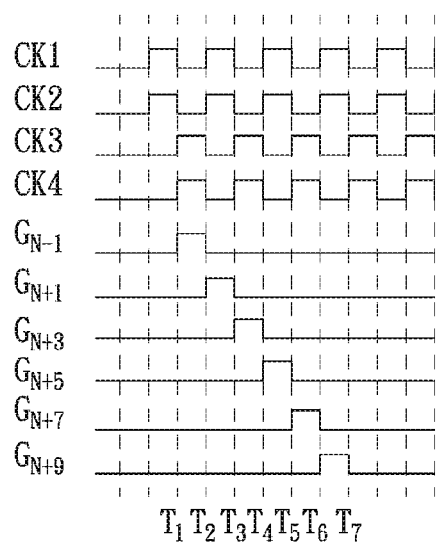
FIG. 5C is a second timing diagram of a second embodiment of a gate driving circuit according to the present disclosure.

Refer to FIG. 5C again. FIG. 5C shows that the gate driving circuit 12 according to the second embodiment of the present disclosure is operated in the second mode, and is a timing diagram showing the second frame. The second frame is another one of the odd frame and the even frame, and the second frame and the first frame are adjacent image frames at time. The level change time of the second clock signal CK2 is earlier than the level change time of the fourth clock signal CK4; and the level enabling period of the second clock signal CK2 does not overlap the level enabling period of the fourth clock signal CK4. In this embodiment, the first clock signal CK1 and the second clock signal CK2 may have the same timing, and the third clock signal CK3 and the fourth clock signal CK4 may have the same timing.

Therefore, when the display device 10 is operated in the second mode and displays the second frame, the second enabling signal STV2 is enabled, the first enabling signal STV1 is disabled, the (P+1)th-stage shift register circuit is enabled, and the Pth-stage shift register circuit is disabled. At the time $T_1$, the (P+1)th-stage shift register circuit enables the outputted (N−1)th-stage drive signal $G_{N−1}$ to be at the enabled voltage level because the fourth clock signal CK4 is at the enabled voltage level. The Nth-stage shift register circuit is disabled because of the (N−2)th-stage drive signal $G_{N−2}$. The (N+1)th-stage shift register circuit is enabled because of the (N−1)th-stage drive signal $G_{N−1}$. At the time $T_2$, when the second clock signal CK2 is enabled, the (N+1)th-stage shift register circuit enables the outputted (N+1)th-stage drive signal $G_{N+1}$ to be at the enabled voltage level. The (N+2)th-stage shift register circuit is disabled because of the Nth-stage drive signal $G_N$. The (N+3)th-stage shift register circuit is enabled because of the (N+1)th-stage drive signal $G_{N+1}$. At the time $T_3$, the fourth clock signal CK4 is enabled, and the (N+3)th-stage drive signal $G_{N+3}$ outputted by the (N+3)th-stage shift register circuit is at the enabled voltage level. The (N+4)th-stage shift register circuit is disabled because of the (N+2)th-stage drive signal $G_{N+2}$. The (N+5)th-stage shift register circuit is enabled because of the (N+3)th-stage drive signal $G_{N+3}$. At the time $T_4$, the second clock signal CK2 is enabled, and the (N+5)th-stage drive signal $G_{N+5}$ outputted by the (N+5)th-stage shift register circuit is at the enabled voltage level. The (N+6)th-stage shift register circuit is disabled because of the (N+4)th-stage drive signal $G_{N+4}$. The (N+7)th-stage shift register circuit is enabled because of the (N+5)th-stage drive signal $G_{N+5}$. At the time $T_5$, the fourth clock signal CK4 is enabled, and the (N+7)th-stage shift register circuit enables the outputted (N+7)th-stage drive signal $G_{N+7}$ to be at the enabled voltage level.

In this embodiment, the level change time of the (N+1)th-stage drive signal $G_{N+1}$ is earlier than the level change time of the (N+3)th-stage drive signal $G_{N+3}$; the level change time of the (N+3)th-stage drive signal $G_{N+3}$ is earlier than the level change time of the (N+5)th-stage drive signal $G_{N+5}$; the level change time of the (N+5)th-stage drive signal $G_{N+5}$ is earlier than the level change time of the (N+7)th-stage drive signal $G_{N+7}$; the level enabling period of the (N+3)th-stage drive signal $G_{N+3}$ does not overlap the level enabling period of the (N+1)th-stage drive signal $G_{N+1}$; the level enabling period of the (N+5)th-stage drive signal $G_{N+5}$ does not overlap the level enabling period of the (N+3)th-stage drive signal $G_{N+3}$; and the level enabling period of the (N+7)th-stage drive signal $G_{N+7}$ does not overlap the level enabling period of the (N+5)th-stage drive signal $G_{N+5}$. In this embodiment, the Nth-stage drive signal $G_N$, the (N+2)th-stage drive signal $G_{N+2}$, the (N+4)th-stage drive signal $G_{N+4}$, and the (N+6)th-stage drive signal $G_{N+6}$ are disabled.

The (Q−1)th-stage shift register circuit is disabled because of the first disabling signal VEND1, and the Qth-stage shift register circuit is enabled because of the second disabling signal VEND2. At the time $T_6$, the Qth-stage shift register circuit enables the outputted (N+9)th-stage drive signal $G_{N+9}$ to be at the enabled voltage level because the second clock signal CK2 is at the enabled voltage level, where the (N+9)th-stage drive signal $G_{N+9}$ is transmitted to the (N+7)th-stage shift register, so as to turn off the (N+7)th-stage shift register, and complete pixel driving of the second frame. The pixel rows driven by the first frame and the second frame are different, and the pixel rows driven by the first frame and the second frame are adjacent. Therefore, when the display device 10 is operated in the second mode, only some of the pixel rows to be displayed are driven when displaying each frame, and adjacent frames drive different pixel rows. In this embodiment, using driving a half of the pixel rows to be displayed as an example, the HFR display mode is simulated.

Figure 6A:
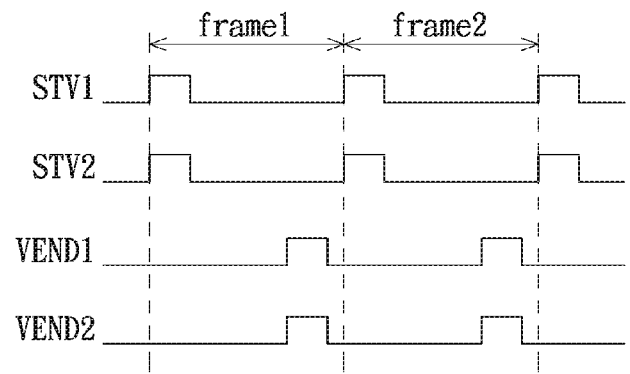
FIG. 6A is a first timing diagram of an enabling signal and a disabling signal according to the present disclosure.
Figure 6B:
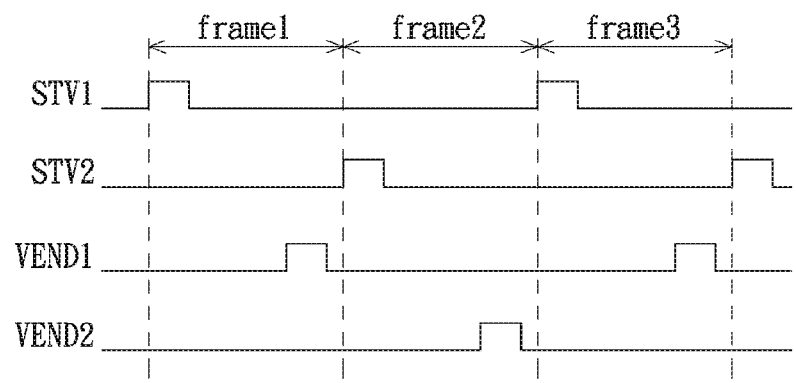
FIG. 6B is a second timing diagram of an enabling signal and a disabling signal according to the present disclosure.

Refer to FIG. 6A and FIG. 6B. FIG. 6A is a schematic diagram of a timing embodiment of the first enabling signal STV1, the second enabling signal STV2, the first disabling signal VEND1, and the second disabling signal VEND2 of the gate driving circuit 12 operated in the first mode according to the present disclosure. FIG. 6B is a schematic diagram of a timing embodiment of the first enabling signal STV1, the second enabling signal STV2, the first disabling signal VEND1, and the second disabling signal VEND2 of the gate driving circuit 12 operated in the second mode according to the present disclosure. A frame 1 and a frame 2 are two frames adjacent at time, where the frame 2 is generated subsequent to the frame 1, the frame 1 is, for example, the foregoing first frame, and the frame 2 is, for example, the foregoing second frame, but is not limited thereto. As stated above, when the gate driving circuit 12 is operated in the first mode, the first enabling signal STV1 and the second enabling signal STV2 of each frame are both enabled, and the first disabling signal VEND1 and the second disabling signal VEND2 are both enabled, as shown in the frame 1 and the frame 2 in FIG. 6A. FIG. 6B is a schematic diagram of a timing embodiment of the first enabling signal STV1, the second enabling signal STV2, the first disabling signal VEND1, and the second disabling signal VEND2 of the gate driving circuit 12 operated in the second mode according to the present disclosure. In FIG. 6B, the first enabling signal STV1 and the second enabling signal STV2 are not simultaneously enabled in the same frame, and the first disabling signal VEND1 and the second disabling signal VEND2 are also not simultaneously enabled in the same frame.

In view of the above, the gate driving circuit 12 of the present disclosure, under a condition of not changing hardware construction of the display device 10, can still be operated in the foregoing first mode and second mode; and achieve an HFR display effect in the second mode by using a driving manner of the gate driving circuit 12 for the pixel rows. In this way, a loss of cost is reduced, and commercial benefits of the display device 10 are further effectively improved.

Although the present disclosure discloses the foregoing by using the embodiments, the foregoing is not intended to limit the present disclosure. Any person of ordinary skill in the art may make some variations and modifications without departing from the scope and spirit of the present disclosure. Therefore, the protection scope of the present disclosure should fall within the scope defined by the appended claims below.

What is claimed is:

1. A gate driving circuit for a display device, comprising a plurality of shift register circuits, wherein:
    an Nth-stage shift register circuit receives a (N−4)th-stage drive signal and a first clock signal, and output an Nth-stage drive signal;
    a (N+1)th-stage shift register circuit receives a (N−3)th-stage drive signal and a third clock signal, and output a (N+1)th-stage drive signal;
    a (N+2)th-stage shift register circuit receives a (N−2)th-stage drive signal and a second clock signal, and output a (N+2)th-stage drive signal;
    a (N+3)th-stage shift register circuit receives a (N−1)th-stage drive signal and a fourth clock signal, and output a (N+3)th-stage drive signal;
    a (N+4)th-stage shift register circuit receives the Nth-stage drive signal and the third clock signal, and output a (N+4)th-stage drive signal;
    a (N+5)th-stage shift register circuit receives the (N+1)th-stage drive signal and the first clock signal, and output a (N+5)th-stage drive signal;
    a (N+6)th-stage shift register circuit receives the (N+2)th-stage drive signal and the fourth clock signal, and output a (N+6)th-stage drive signal; and
    a (N+7)th-stage shift register circuit receives the (N+3)th-stage drive signal and the second clock signal, and output a (N+7)th-stage drive signal,
    wherein, N is a positive integer; and
    wherein when the display device is operated in a first mode, a level change time of a first pulse of the first clock signal is earlier than a level change time of a first pulse of the second clock signal; the level change time of the first pulse of the second clock signal is earlier than a level change time of a first pulse of the third clock signal; the level change time of the first pulse of the third clock signal is earlier than a level change time of a first pulse of the fourth clock signal; a level enabling period of the first pulse of the second clock signal partially overlaps a level enabling period of the first pulse of the first clock signal; a level enabling period of the first pulse of the third clock signal partially overlaps the level enabling period of the first pulse of the second clock signal; a level enabling period of the first pulse of the fourth clock signal partially overlaps the level enabling period of the first pulse of the third clock signal; the level enabling period of the first pulse of the third clock signal does not overlap the level enabling period of the first pulse of the first clock signal; the level enabling period of the first pulse of the fourth clock signal does not overlap the level enabling period of the first pulse of the second clock signal; a level change time of a second pulse of the second clock signal is earlier than a level change time of a second pulse of the first clock signal; the level change time of the second pulse of the first clock signal is earlier than a level change time of a second pulse of the fourth clock signal; the level change time of the second pulse of the fourth clock signal is earlier than a level change time of a second pulse of the third clock signal; a level enabling period of the second pulse of the first clock signal partially overlaps a level enabling period of the second pulse of the second clock signal; a level enabling period of the second pulse of the fourth clock signal partially overlaps a level enabling period of the second pulse of the first clock signal; a level enabling period of the second pulse of the third clock signal partially overlaps a level enabling period of the second pulse of the fourth clock signal; the level enabling period of the second pulse of the third clock signal does not overlap the level enabling period of the second pulse of the first clock signal; and the level enabling period of the second pulse of the fourth clock signal does not overlap the level enabling period of the second pulse of the second clock signal.

2. The gate driving circuit according to claim 1, wherein a level change time of the Nth-stage drive signal is earlier than a level change time of the (N+1)th-stage drive signal; the level change time of the (N+1)th-stage drive signal is earlier than a level change time of the (N+2)th-stage drive signal; the level change time of the (N+2)th-stage drive signal is earlier than a level change time of the (N+3)th-stage drive signal; the level change time of the (N+3)th-stage drive signal is earlier than a level change time of the (N+4)th-stage drive signal; the level change time of the (N+4)th-stage drive signal is earlier than a level change time of the (N+5)th-stage drive signal; the level change time of the (N+5)th-stage drive signal is earlier than a level change time of the (N+6)th-stage drive signal; the level change time of the (N+6)th-stage drive signal is earlier than a level change time of the (N+7)th-stage drive signal; a level enabling period of the (N+1)th-stage drive signal partially overlaps a level enabling period of the Nth-stage drive signal; a level enabling period of the (N+2)th-stage drive signal partially overlaps the level enabling period of the (N+1)th-stage drive signal; a level enabling period of the (N+3)th-stage drive signal partially overlaps the level enabling period of the (N+2)th-stage drive signal; a level enabling period of the (N+4)th-stage drive signal partially overlaps the level enabling period of the (N+3)th-stage drive signal; a level enabling period of the (N+5)th-stage drive signal partially overlaps the level enabling period of the (N+4)th-stage drive signal; a level enabling period of the (N+6)th-stage drive signal partially overlaps the level enabling period of the (N+5)th-stage drive signal; and a level enabling period of the (N+7)th-stage drive signal partially overlaps the level enabling period of the (N+6)th-stage drive signal.

3. A gate driving circuit for a display device, comprising a plurality of shift register circuits, wherein:

an Nth-stage shift register circuit receives a (N−4)th-stage drive signal and a first clock signal, and output an Nth-stage drive signal;

a (N+1)th-stage shift register circuit receives a (N−3)th-stage drive signal and a third clock signal, and output a (N+1)th-stage drive signal;

a (N+2)th-stage shift register circuit receives a (N−2)th-stage drive signal and a second clock signal, and output a (N+2)th-stage drive signal;

a (N+3)th-stage shift register circuit receives a (N−1)th-stage drive signal and a fourth clock signal, and output a (N+3)th-stage drive signal;

a (N+4)th-stage shift register circuit receives the Nth-stage drive signal and the third clock signal, and output a (N+4)th-stage drive signal;

a (N+5)th-stage shift register circuit receives the (N+1)th-stage drive signal and the first clock signal, and output a (N+5)th-stage drive signal;

a (N+6)th-stage shift register circuit receives the (N+2)th-stage drive signal and the fourth clock signal, and output a (N+6)th-stage drive signal; and a (N+7)th-stage shift register circuit receives the (N+3)th-stage drive signal and the second clock signal, and output a (N+7)th-stage drive signal, wherein, N is a positive integer; and wherein when the display device is operated in a second mode and displays a first frame, a level change time of the first clock signal is earlier than a level change time of the third clock signal; the level change time of the third clock signal is earlier than a level change time of the second clock signal; the level change time of the second clock signal is earlier than a level change time of the fourth clock signal; a level enabling period of the third clock signal partially overlaps a level enabling period of the first clock signal; a level enabling period of the second clock signal partially overlaps the level enabling period of the third clock signal; a level enabling period of the fourth clock signal partially overlaps the level enabling period of the second clock signal; the level enabling period of the second clock signal does not overlap the level enabling period of the first clock signal; and the level enabling period of the fourth clock signal does not overlap the level enabling period of the third clock signal.

4. The gate driving circuit according to claim 3, wherein a level change time of the Nth-stage drive signal is earlier than a level change time of the (N+2)th-stage drive signal; the level change time of the (N+2)th-stage drive signal is earlier than a level change time of the (N+4)th-stage drive signal; the level change time of the (N+4)th-stage drive signal is earlier than a level change time of the (N+6)th-stage drive signal; a level enabling period of the (N+2)th-stage drive signal partially overlaps a level enabling period of the Nth-stage drive signal; a level enabling period of the (N+4)th-stage drive signal partially overlaps the level enabling period of the (N+2)th-stage drive signal; and a level enabling period of the (N+6)th-stage drive signal partially overlaps the level enabling period of the (N+4)th-stage drive signal.

5. The gate driving circuit according to claim 3, wherein when the display device is operated in a second mode and displays a second frame, the second frame is generated subsequent to the first frame; the level change time of the second clock signal is earlier than the level change time of the fourth clock signal; the level change time of the fourth clock signal is earlier than the level change time of the first clock signal; the level change time of the first clock signal is earlier than the level change time of the third clock signal; the level enabling period of the fourth clock signal partially overlaps the level enabling period of the second clock signal; the level enabling period of the first clock signal partially overlaps the level enabling period of the fourth clock signal; the level enabling period of the third clock signal partially overlaps the level enabling period of the first clock signal; the level enabling period of the second clock signal does not overlap the level enabling period of the first clock signal; and the level enabling period of the fourth clock signal does not overlap the level enabling period of the third clock signal.

6. The gate driving circuit according to claim 5, wherein a level change time of the (N+1)th-stage drive signal is earlier than a level change time of the (N+3)th-stage drive signal; the level change time of the (N+3)th-stage drive signal is earlier than a level change time of the (N+5)th-stage drive signal; the level change time of the (N+5)th-stage drive signal is earlier than a level change time of the (N+7)th-stage drive signal; a level enabling period of the (N+3)th-stage drive signal partially overlaps a level enabling period of the (N+1)th-stage drive signal; a level enabling period of the (N+5)th-stage drive signal partially overlaps the level enabling period of the (N+3)th-stage drive signal; and a level enabling period of the (N+7)th-stage drive signal partially overlaps the level enabling period of the (N+5)th-stage drive signal.

7. A gate driving circuit for a display device, comprising a plurality of shift register circuits, wherein:

an Nth-stage shift register circuit receives a (N−4)th-stage drive signal and a first clock signal, and output an Nth-stage drive signal;

a (N+1)th-stage shift register circuit receives a (N−3)th-stage drive signal and a third clock signal, and output a (N+1)th-stage drive signal;

a (N+2)th-stage shift register circuit receives a (N−2)th-stage drive signal and a second clock signal, and output a (N+2)th-stage drive signal;

a (N+3)th-stage shift register circuit receives a (N−1)th-stage drive signal and a fourth clock signal, and output a (N+3)th-stage drive signal;

a (N+4)th-stage shift register circuit receives the Nth-stage drive signal and the third clock signal, and output a (N+4)th-stage drive signal;

a (N+5)th-stage shift register circuit receives the (N+1)th-stage drive signal and the first clock signal, and output a (N+5)th-stage drive signal;

a (N+6)th-stage shift register circuit receives the (N+2)th-stage drive signal and the fourth clock signal, and output a (N+6)th-stage drive signal; and a (N+7)th-stage shift register circuit receives the (N+3)th-stage drive signal and the second clock signal, and output a (N+7)th-stage drive signal, wherein, N is a positive integer; and wherein the gate driving circuit further comprises an enabling shift register circuit unit, the enabling shift register circuit unit comprising:

a Pth-stage shift register circuit, receiving a first enabling signal and the second clock signal;

a (P+1)th-stage shift register circuit, receiving a second enabling signal and the first clock signal;

a (P+2)th-stage shift register circuit, receiving the first enabling signal and the fourth clock signal; and a (P+3)th-stage shift register circuit, receiving the second enabling signal and the second clock signal; and a disabling shift register circuit unit, the disabling shift register circuit unit comprising:

a (Q−3)th-stage shift register circuit, receiving a first disabling signal and the first clock signal;

a (Q−2)th-stage shift register circuit, receiving a second disabling signal and the third clock signal;

a (Q−1)th-stage shift register circuit, receiving the first enabling signal and the second clock signal; and a Qth-stage shift register circuit, receiving a second disabling signal and the fourth clock signal, wherein, P is a positive integer less than N, and Q is a positive integer greater than N+7.

8. A gate driving circuit for a display device, comprising a plurality of shift register circuits, wherein:

an Nth-stage shift register circuit receives an (N−2)th-stage drive signal and a first clock signal, and output an Nth-stage drive signal;

a (N+1)th-stage shift register circuit receives a (N−1)th-stage drive signal and a second clock signal, and output a (N+1)th-stage drive signal;

a (N+2)th-stage shift register circuit receives the Nth-stage drive signal and a third clock signal, and output a (N+2)th-stage drive signal; and a (N+3)th-stage shift register circuit receives the (N+1)th-stage drive signal and a fourth clock signal, and output a (N+3)th-stage drive signal, wherein, N is a positive integer greater than zero;

wherein when the display device is operated in a second mode and displays a first frame, a level change time of the first clock signal is earlier than a level change time of the third clock signal; and a level enabling period of the third clock signal does not overlap a level enabling period of the first clock signal; and wherein when the display device is operated in the second mode and displays a second frame, the second frame is generated subsequent to the first frame; a level change time of the second clock signal is earlier than a level change time of the fourth clock signal; and a level enabling period of the second clock signal does not overlap a level enabling period of the fourth clock signal.

9. The gate driving circuit according to claim 8, wherein when the display device is operated in a first mode, a level change time of the first clock signal is earlier than the second clock signal; a level change time of the second clock signal is earlier than the third clock signal; a level change time of the third clock signal is earlier than the fourth clock signal; a level enabling period of the second clock signal does not overlap a level enabling period of the first clock signal; a level enabling period of the third clock signal does not overlap the level enabling period of the second clock signal; and a level enabling period of the fourth clock signal does not overlap the level enabling period of the third clock signal.

10. The gate driving circuit according to claim 9, wherein a level change time of the Nth-stage drive signal is earlier than a level change time of the (N+1)th-stage drive signal; the level change time of the (N+1)th-stage drive signal is earlier than a level change time of the (N+2)th-stage drive signal; the level change time of the (N+2)th-stage drive signal is earlier than a level change time of the (N+3)th-stage drive signal; a level enabling period of the (N+1)th-stage drive signal does not overlap a level enabling period of the Nth-stage drive signal; a level enabling period of the (N+2)th-stage drive signal does not overlap the level enabling period of the (N+1)th-stage drive signal; and a level enabling period of the (N+3)th-stage drive signal does not overlap the level enabling period of the (N+2)th-stage drive signal.

11. The gate driving circuit according to claim 8, wherein a level change time of the Nth-stage drive signal is earlier than a level change time of the (N+2)th-stage drive signal; and a level enabling period of the (N+2)th-stage drive signal does not overlap a level enabling period of the Nth-stage drive signal.

12. The gate driving circuit according to claim 11, wherein the (N+1)th-stage drive signal and the (N+3)th-stage drive signal are disabled.

13. The gate driving circuit according to claim 8, wherein a level change time of the (N+1)th-stage drive signal is earlier than a level change time of the (N+3)th-stage drive signal; and a level enabling period of the (N+3)th-stage drive signal does not overlap a level enabling period of the (N+1)th-stage drive signal.

14. The gate driving circuit according to claim 13, wherein the Nth-stage drive signal and the (N+2)th-stage drive signal are disabled.

15. The gate driving circuit according to claim 8, wherein the gate driving circuit further comprises an enabling shift register circuit unit, the enabling shift register circuit unit comprising:

a Pth-stage shift register circuit, receiving a first enabling signal and the second clock signal; and a (P+1)th-stage shift register circuit, receiving a second enabling signal and the fourth clock signal; and a disabling shift register circuit unit, the disabling shift register circuit unit comprising:

a (Q−1)th-stage shift register circuit, receiving a first disabling signal and the first clock signal; and a Q-stage shift register circuit, receiving a second disabling signal and the third clock signal, wherein, P is a positive integer less than N, and Q is a positive integer greater than N+7.

* * * * *